United States Patent [19]

Chase

[11] Patent Number: 4,506,210
[45] Date of Patent: Mar. 19, 1985

[54] METHOD FOR IDENTIFYING CABLE CONDUCTORS USING TWO SIGNALS AT DIFFERENT FREQUENCIES

[75] Inventor: Roger P. Chase, Wheaton, Md.

[73] Assignee: The United States of America as represented by the Secretary of the Army, Washington, D.C.

[21] Appl. No.: 349,737

[22] Filed: Feb. 18, 1982

[51] Int. Cl.³ ............................................ G01R 19/00
[52] U.S. Cl. ...................................................... 324/66
[58] Field of Search .................. 324/66; 179/175, 3 A

[56] References Cited

U.S. PATENT DOCUMENTS

| | | | |
|---|---|---|---|
| 2,731,598 | 1/1956 | Herbert | 324/52 |
| 3,181,062 | 4/1965 | Scarlett | 324/66 |
| 3,252,087 | 5/1966 | Parke | 324/66 |
| 3,826,977 | 7/1974 | Woodworth | 324/66 |

*Primary Examiner*—Gerard R. Strecker
*Assistant Examiner*—Walter E. Snow
*Attorney, Agent, or Firm*—Anthony T. Lane; Robert P. Gibson; Saul Elbaum

[57] ABSTRACT

A system for identifying a selected conductor at the other end of a multi-conductor cable. A signal is imposed on the selected conductor at one end. At the other end of the cable, a probe is capacitively coupled successively to the several conductors. The selected conductor is identified by the relatively large capacitively coupled signal.

When capacitive coupling between wires may degrade system performance, signals of two different frequencies may be applied to the selected conductor and another conductor, respectively. The selected conductor can be identified by the large ratio of the magnitude of signal detected at the frequency applied to the selected conductor as compared to the magnitude of the signal detected at the other frequency.

1 Claim, 2 Drawing Figures

METHOD FOR IDENTIFYING CABLE CONDUCTORS USING TWO SIGNALS AT DIFFERENT FREQUENCIES

RIGHTS OF THE GOVERNMENT

The invention described herein may be manufactured, used and licensed by or for the U.S. Government for governmental purposes without the payment to me of any royalty thereon.

BACKGROUND OF THE INVENTION

The invention relates generally to test apparatus and systems, and particularly to systems and methods for tracing conductors through multi-conductor cables, by which term it is intended to include harnessed conductors.

While the conductors of a cable are generally color coded, it frequently happens that conductors or wires are made into a cable in which the wires are not color coded. In the absence of such coding, it is difficult to trace or identify at a second end of the cable a particular wire selected at a first end thereof. One method of doing this is to use an ohmmeter having one lead thereof connected at one end of the cable to the wire to be traced and using the other lead of the ohmmeter to probe or test the wires at the other end of the cable. Each of the wires at the other end of the cable must be checked one at a time, until a low resistance path is detected. The ends of this selected wire are then labeled to indicate opposite ends thereof. This process may then be repeated for each wire. This procedure is tedious and time consuming because, as the wires are probed, each wire must be contacted metal to metal with the probe, which often involves piercing the insulation of each conductor.

SUMMARY OF THE INVENTION

In order to identify the other end of a selected conductor of a multi-conductor cable, an alternating current signal is applied to the wire at one end thereof and the input of a high gain, high input impedance amplifier is capacitively coupled at the other end of the cable to successive conductors. By amplifying and detecting the capacitively coupled signal, one can identify the other end of the selected conductor or wire. Compared with signals similarly detected among other wires of the cable, a comparatively large signal identifies the selected wire. The present invention also comprises apparatus for practicing the method of the present invention.

An alternate embodiment of the present invention employs an alternating current signal of a different frequency applied to a second wire at the one cable end. A second high gain, high input impedance amplifier is capacitively coupled at the other end to each wire successively, and the detected and amplified signals are compared. The selected wire is identified when a large ratio of the first signal to the second signal is detected. DR

DETAILED DESCRIPTION OF THE PREFERRED EMBODIMENT

Figure 1:
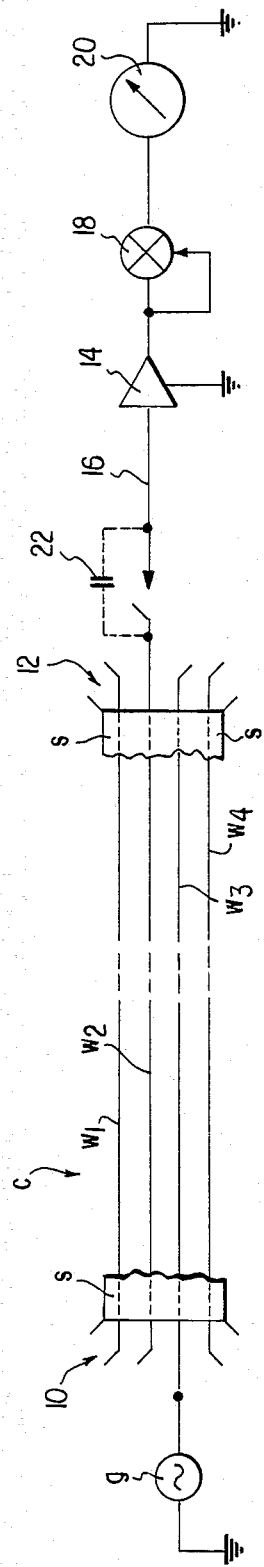
FIG. 1 schematically illustrates a first embodiment of the invention.

Referring now to FIG. 1, a cable c has several electrically conductive wires of which only four $w_1$, $w_2$, $w_3$ and $w_4$ are shown. At one end 10 of cable c, an alternating generator g is connected between ground, indicated by the conventional symbol, and a particular wire $w_3$. The wires are collected in a bundle or group comprising cable c, which may include a shield s. A high gain amplifier 14, also having a high input impedance, and preferably tuned to the frequency of oscillation of generator g, is connected at its input end to a probe 16, and at its output to a detector 18, the output of detector 18 being connected to an indicator 20, here shown as an ordinary ammeter. Probe 16 may have a shielded, grounded cover (not shown) except at the end thereof which is placed adjacent the cable. Amplifier 14, detector 18 and indicator 20 are suitably grounded.

When the end of probe 16 is brought near to a particular wire, the signal originating from generator g is fed via capacitive coupling 22 into amplifier 14, is detected in detector 18 and indicated by indicator 20. This method is advantageous in that no metal-to-metal contact of probe 16 to the wires at remote end 12 is necessary. A great saving of time is realized as probe 16 need only be brought into proximity with each wire in turn. When probe 16 is brought near wire $w_3$, indicator 20 will show a substantial signal, 2-, 3-, or 10-times as great as compared to the signal derived when probe 16 is near the other wires. Thus, identifying the particular wire to which generator g is connected is simplified and can be done rapidly.

The technique just described is practical only for relatively short cables because, after a certain length for a given type cable, the parasitic capacitance between the wire being traced and the other wires causes all the wires to exhibit approximately the same or similar signal strengths at remote end 12. This difficulty may be overcome by an alternate embodiment of the present invention illustrated in FIG. 2, in which like reference numerals refer to like parts. The embodiment of FIG. 2 may be used with longer cables than the embodiment described in connection with FIG. 1.

Figure 2:
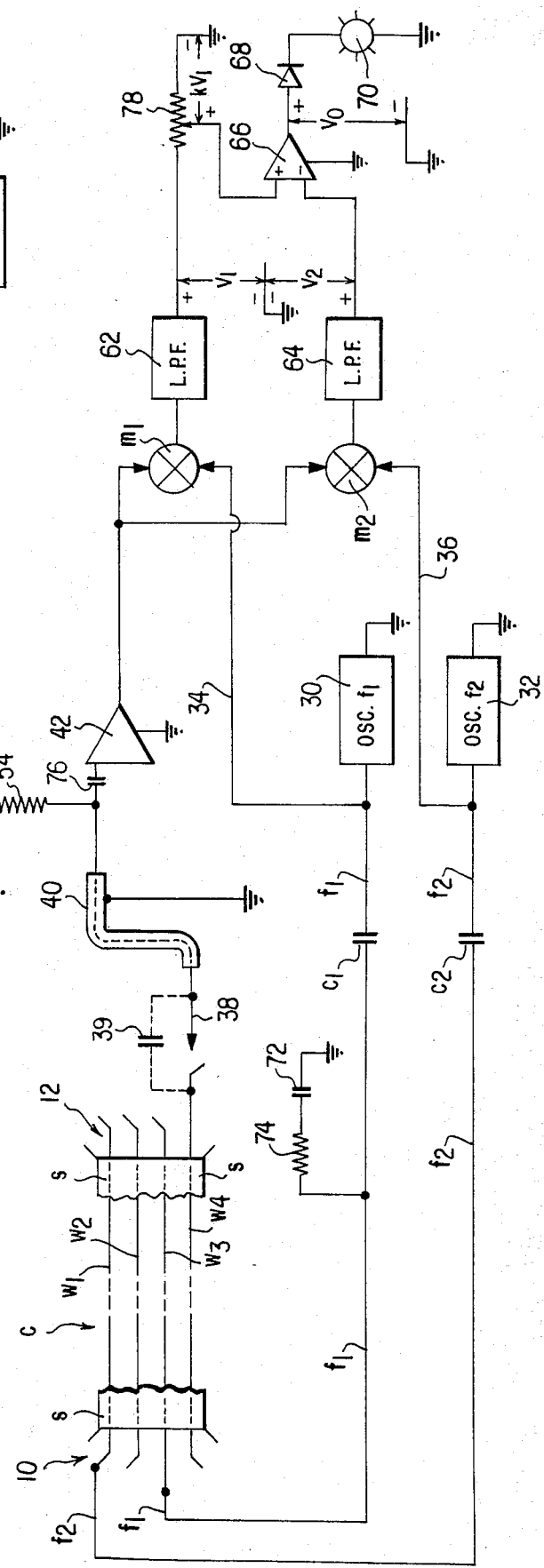
FIG. 2 schematically illustrates a second embodiment of the invention.

In FIG. 2, an oscillator 30 supplies oscillations at frequency $f_1$ through a capacitor $c_1$ to one end of wire $w_3$. A second oscillator 32 generates a signal of a different frequency $f_2$ which is applied through a second capacitor $c_2$ to a different wire $w_1$. Oscillations at frequency $f_1$ from oscillator 30 are also applied by a lead 34 to a mixer $m_1$, and oscillations at frequency $f_2$ from oscillator 32 are applied by a lead 36 to a mixer $m_2$. A probe 38 may be capacitively coupled, as at 39, by its proximity to any one of the various wires, being illustrated in FIG. 2 as capacitively coupled to wire $w_4$. Probe 38, which may be shielded by a shield 40, is coupled to the input of amplifer 42 through a capacitor 76. Shield 40 and amplifier 42 are connected to a common ground. The output of amplifier 42 is applied to the respective inputs of mixers $m_1$, $m_2$. The outputs of mixers $m_1$, $m_2$ are connected through low pass filters 62 and 64, respectively, to the inputs of a voltage divider 78 and the negative input of a differential amplifier 66, respectively.

The output of voltage divider 78 is applied to the positive input of differential amplifier 66. Voltage divider 78 reduces the voltage from low pass filter 62 by a factor in the range of one-half to one-twentieth, for example. The output of amplifier 66 is connected to the anode of a diode 68, the cathode of which is connected to one terminal of a signal lamp 70, the other terminal of which is grounded.

Shield 40 of probe 38 is preferably made adjustable to expose varying portions of probe 38 in the vicinity of remote end 12, whereby a broad or narrow spatial sensitivity pattern may be developed. Amplifier 42 is a high gain, high input impedance amplifier. Mixers $m_1$, $m_2$ and associated low pass filters 62, 64 comprise synchronous detectors for the signals at frequencies $f_1$ and $f_2$. The voltage divider provides a weighting factor, preferably less than 1. The difference of the weighted and unweighted synchronous detector outputs drives the indicator lamp through the amplifier 66 and diode 68.

An additional circuit is provided for convenient continuity checking, if desired. A D.C. bias voltage (e.g., 3 volts) is applied to selected wire $w_3$ through a resistor 74 from a source 72 referenced to common ground. A resistor 54 is connected between probe 38 and capacitor 49 and through amplifier 50 to tone generator 58. The other ends of capacitor 49 and tone generator 58 go to common ground. Resistor 54, which has a high resistance (e.g., 2 megohms) and capacitor 49 function as a low pass filter.

When a direct contact is made between probe 38 and wire $w_3$ in cable c (but not for the other wires), a sufficient DC bias is developed to energize tone generator 58 or other signal generator to indicate that the desired wire has indeed been identified. Becauseof the D.C. bias 72 applied to $w_3$ through a suitable resistor 74, the tone generator circuit will respond only to direct connection to selected wire $w_3$.

Each wire in cable c carries both signals of frequencies $f_1$ and $f_2$ either by reason of direct connection of the wire to the respective signal source or due to coupling by inter-wire capacitance to such a directly connected wire. Of all the wires in cable c, the selected wire, here shown as $w_3$, has the highest ratio of the amplitude of signal of frequency $f_1$ to the amplitude of signal of frequency $f_2$. When probe 38 is brought into proximity with one of the wires (e.g., $w_4$), the signals present on that wire are coupled through capacitance 39, capacitor 76 and amplifier 42 to the synchronous filters comprised of mixers $m_1$ and $m_2$ and low pass filters 62 and 64. The voltage $v_1$ at the output of low pass filter 62 is a measure of the amplitude of the signal of frequency $f_1$ in test wire $w_4$. Similarly, the voltage $v_2$ at the output of low pass filter 64 is a measure of the amplitude of the signal of frequency $f_2$ in test wire $w_4$. The potentiometer 78 decreases $v_1$ by a factor k which is less than one. The voltages $kv_1$ and $v_2$ enter differential amplifier 66 on the positive and negative inputs, respectively. The output of amplifier 66 will be positive and light indicator lamp 70 only if $kv_1$ is greater than $v_2$. This requires that the ratio of the amplitude of signal at frequency $f_2$ to the amplitude of signal at frequency $f_1$ be equal to or less than k which is a small fraction (typically 1/10 to 1/50). The fraction k is the amplitude ratio threshold factor.

The method of the present invention will be apparent from the foregoing. One adjusts the factor k to a value that is likely to be exceeded by the amplitude ratios on each wire except the one receiving the signal $f_1$. This will be determined by such parameters as cable length, level of inter-conductor capacitive coupling, etc. Then one positions probe 38 in the vicinity of the various wires at end 12 of cable c. When probe 38 is in the vicinity of the wire having the signal $f_1$ applied thereto, shown here as $w_3$, the amplitude ratio $v_2/v_1$ will be less than k, and the output $v_0$ of amplifier 66 will be positive and, through diode 68, drive lamp 70 or other indicating device.

It may occur that two or more wires of cable c will be found to have amplitude ratios less than k. In such cases the continuity test method is used to determine which of these relatively few candidates is the selected wire. The tip of probe 38 is touched metal-to-metal to each candidate wire in turn until the tone generator sounds indicating a DC bias on the tested wire, shown here as $w_3$. In all cases it will be found that the contactless method described above eliminates all but one or a few wires from consideration and the continuity test may be used to positively identify the selected wire from among the one or few remaining candidate wires.

The identifying signals $f_1$ and $f_2$ may be applied as above at the transmitting end, and ordinary bandpass filtering and detection, rather than synchronous detection, may be used at the receiving end to identify the wire to which the $f_1$ frequency signal is applied. The ratio of amplitudes $f_1$ to $f_2$ will still be much greater on the selected wire than any of the others. Identification of the selected line may then, if desired, be verified by probe contact and response of the tone generator circuit.

It is apparent from the foregoing that the system and method provides a rapid and simple way of identifying which wire at a remote end of a cable is identical with a selected wire at the transmitting end of the cable. Physical direct contact is not required, except perhaps to confirm the identification achieved by the system and method of the present invention.

I wish it to be understood that I do not desire to be limited to the exact details of construction shown and described, for obvious modifications can be made by a person skilled in the art.

I claim as my invention:

1. A method for testing a cable comprising a plurality of conductors to identify which conductor at a second end of the cable is continuous with a selected conductor at a first end of the cable, the method comprising the steps of:
    applying an alternating current signal to the selected conductor at the first cable end;
    applying a second alternating current signal of a frequency different from that of the first recited alternating current signal to a second conductor at the first end of the cable;
    capacitively coupling a high gain, high input impedance amplifier at the second end of the cable to a chosen conductor;
    amplifying and filtering the coupling signal in two parallel frequency selective filters tuned to the frequencies of said first and second recited alternating current signals, respectively; and
    comparing the amplitudes of said filtered signals to determine if said chosen conductor is said selected conductor.

* * * * *